(12) United States Patent
Srinivasa et al.

(10) Patent No.: US 8,174,425 B1
(45) Date of Patent: May 8, 2012

(54) ASYNCHRONOUS PULSE PROCESSING APPARATUS AND METHOD PROVIDING SIGNAL NORMALIZATION

(75) Inventors: Narayan Srinivasa, Oak Park, CA (US); Jose Cruz-Albrecht, Oak Park, CA (US); Peter Petre, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 152 days.

(21) Appl. No.: 12/815,350

(22) Filed: Jun. 14, 2010

(51) Int. Cl.
*H03M 1/50* (2006.01)

(52) U.S. Cl. ........ 341/166; 382/103; 375/211; 375/242; 455/344; 370/212

(58) Field of Classification Search .......... 341/143–166; 382/103; 375/211, 242; 455/344; 370/212
See application file for complete search history.

(56) References Cited

U.S. PATENT DOCUMENTS

| | | | |
|---|---|---|---|
| 5,345,398 A | 9/1994 | Lippmann et al. | |
| 5,479,170 A | 12/1995 | Cauwenberghs et al. | |
| 5,894,280 A | 4/1999 | Ginetti et al. | |
| 6,452,524 B1 | 9/2002 | Fraleigh et al. | |
| 6,473,019 B1 | 10/2002 | Ruha et al. | |
| 6,975,682 B2 | 12/2005 | Cosand | |
| 7,038,608 B1 | 5/2006 | Gilbert | |
| 7,403,144 B1 | 7/2008 | Cruz-Albrecht et al. | |
| 7,405,686 B2 | 7/2008 | Laroia et al. | |
| 7,515,084 B1 | 4/2009 | Cruz-Albrecht et al. | |
| 7,592,939 B1 | 9/2009 | Cruz-Albrecht et al. | |
| 7,724,168 B1 | 5/2010 | Cruz-Albrecht et al. | |
| 7,750,835 B1 * | 7/2010 | Cruz-Albrecht et al. | 341/166 |
| 7,948,869 B2 * | 5/2011 | Petre et al. | 370/212 |
| 7,965,216 B1 * | 6/2011 | Petre et al. | 341/155 |
| 8,040,265 B2 * | 10/2011 | Cruz-Albrecht et al. | 341/143 |

OTHER PUBLICATIONS

J. M. Cruz et al., "A 16 c 16 Cellular Neural Network Universal Chip: The First Complete Single-Chip Dynamic Computer Array with Distributed Memory and with Gray-Scale Input-Output," Analog Integrated Circuits and Signal Processing, vol. 15, 1998, pp. 227-237.
A. A. Lazar et al., "Perfect Recovery and Sensitivity Analysis of Time Encoded Bandlimited Signals," IEEE Trans on Circuits and Systems-I: Regular Papers, vol. 51, No. 10, Oct. 2004, pp. 2060-2073.
A. M. Dighe et al., "An Asynchronous Serial Flash Converter," 9th Int. Conf. on Electronics, Circuits and Systems, IEEE, 2002, pp. 13-15.
D. Donoho, "Compressed Sensing," IEEE Trans. on Information Theory, vol. 42, No. 4, Apr. 2006, pp. 1289-1306.

(Continued)

*Primary Examiner* — Lam T Mai
(74) *Attorney, Agent, or Firm* — North Shore Assoc.

(57) ABSTRACT

An asynchronous pulse processing (APP) apparatus, an APP system and a method of signal normalization employing APP provide signal normalization. The APP apparatus includes a gain block configured to scale an input signal by a first scale value and a summation block configured to produce a composite signal by subtracting from the scaled input signal each of a normalized signal scaled by a second scale value and the normalized signal multiplied by a summation signal. The APP apparatus further includes an integrator and a time encoder configured to produce the normalized signal from the composite signal. The APP system includes a plurality of APP apparatuses as APP channels. The method of signal normalization includes generating the composite signal from the scaled input signal and integrating and time encoding the composite signal to produce the normalized signal.

20 Claims, 3 Drawing Sheets

OTHER PUBLICATIONS

M. Iwamoto et al., "Bandpass Delta-Sigma Class-S Amplifier," Electronics Letters, vol. 36, No. 12, Jun. 2000, pp. 1010-1012.

J. Keane et al., "Impulses and Stochastic Arithmetic for Signal Processing," Proc. 2001 IEEE Int. Conf. on Acoustics, Speech and Signal Processing, 2001, pp. 1257-1260.

E. Roza, "Analog to Digital Conversion via Duty Cycle Modulation," IEEE Trans. on Circuits and Systems-II, vol. 44, No. 11, 1997, pp. 907-914.

R. Walden, "Analog to Digital Converter Survey and Analysis," IEEE J. on Selected Areas in Communications, vol. 17, No. 4, Apr. 1999, pp. 539-550.

Y. Xia et al., "A Recurrent Neural Network for Solving Nonlinear Convex Programs Subject to Linear Constraints," IEEE Trans. on Neural Networks, vol. 16, No. 2, Mar. 2005, pp. 379-386.

S. Funahashi et al., "Prefrontal Neuronal Activity in Rhesus Monkeys Performing a Delayed Anti-Saccade Task," Nature, vol. 365, No. 21, Oct. 1993, pp. 753-756.

J. J. Hopfield, "Neural networks and physical systems with emergent collective computational abilities," Proc., Natl. Acad. Sci., vol. 79, Apr. 1982, pp. 2554-2558.

S. Grossberg, "Why to Cells Compete? Some Examples from Visual Perception," UMAP Journal, vol. III, No. 1, 1982, pp. 103-121.

Cohen et al., "Absolute Stability of Global Pattern Formation and Parallel Memory Storage by Competitive Neural Networks," IEEE Trans. on Systems, Man, and Cybernetics, vol. SMC-13, No. 5, Sep./Oct. 1983, pp. 815-826.

J. M. Fuster, "Unit activity in the prefrontal cortex during delayed response performance: neuronal correlates of transient memory," Journal of Neurophysiology, vol. 36, 1973, pp. 61-78.

A. A. Lazar et al., "Perfect Recovery and Sensitivity Analysis of Time Encoded Bandlimited Signals," BNET Technical Report #1-03, Department of Electrical Engineering, Columbia University, New York, NY, Sep. 2003, pp. 1-30.

* cited by examiner

ASYNCHRONOUS PULSE PROCESSING APPARATUS AND METHOD PROVIDING SIGNAL NORMALIZATION

CROSS-REFERENCE TO RELATED APPLICATIONS

N/A

STATEMENT REGARDING FEDERALLY SPONSORED RESEARCH OR DEVELOPMENT

N/A

BACKGROUND

1. Technical Field

The invention relates to analog circuits and systems. In particular, the invention relates to encoding and processing a plurality of input signals.

2. Description of Related Art

Multi-channel systems used in various modern processing and control applications are becoming more and more commonplace and important. For example, processing signals from a large array of sensors (e.g., a focal plane array of optical sensors) almost always involves simultaneous or nearly simultaneous processing of multiple, parallel channels from the sensor array. However, while important for many real world, modern applications, such multi-channel systems often present significant design challenges including, but not limited to, providing simultaneous processing capability for a plurality of wide dynamic range signals on the multiple, adjacent channels present in such systems. Problems including, but not limited to, the so-called noise-saturation dilemma, in which a large signal on one channel interferes with processing of small, effectively noise-like signals in adjacent channels, generally must be addressed in the design of the multi-channel system. Neuromorphic circuits and related circuit topologies may offer a solution to some of these significant obstacles associated with the design of multi-channel systems.

Neuromorphic circuits are electronic circuits that mimic the operation of cell populations within a nervous system and as such, may offer a number of advantages for robust signal processing in support of various multi-channel control and sensor processing applications. In particular, neuromorphic circuits may facilitate robust multi-channel signal processing in a manner that mimics certain populations of neural cells including, but not limited to, populations of neural cells found in a brain, for example. As an animal's brain is generally adept at processing and interpreting a barrage of signals received from an animal's environment in a robust manner, so to are various neuromorphic circuits that mimic brain-like functions. Specifically, the neuromorphic circuit may perform various brain-like functions in a robust manner substantially similar or at least modeled on its biological counterpart. An example of a neuromorphic circuit topology that offers some significant promise is the feed-forward, on-center off-surround network. The challenge remains developing practical implementations and more particularly low-power integrated circuit implementations for multi-channel control and processing systems that facilitate using neuromorphic circuits such as the feed-forward, on-center off-surround network topology.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
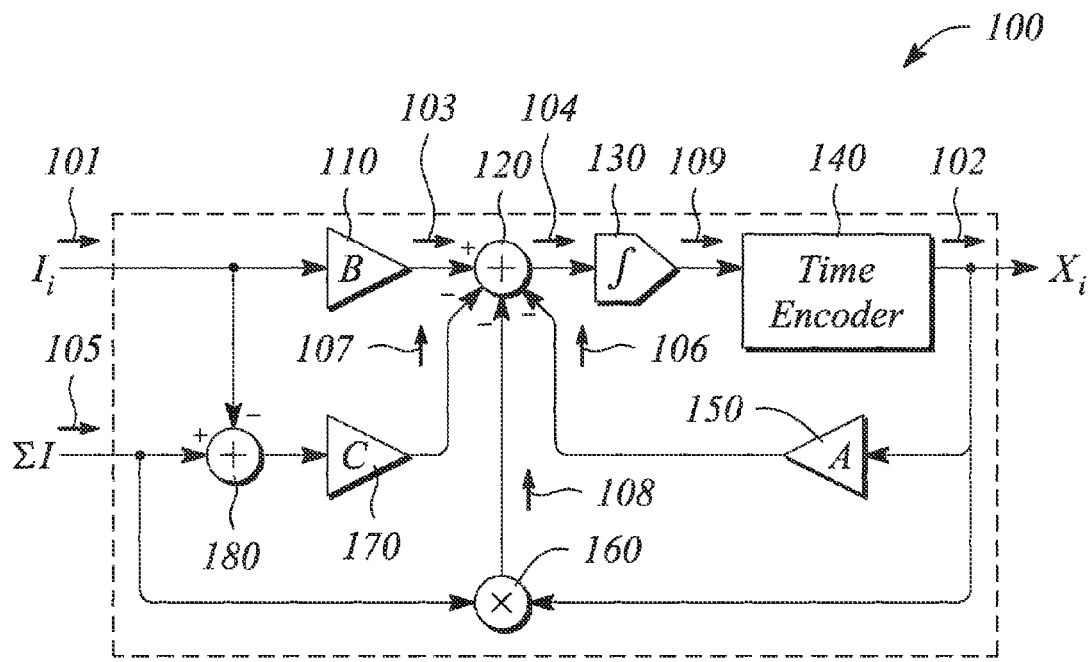
FIG. 1 illustrates a block diagram of an asynchronous pulse processing (APP) apparatus, according to an embodiment of the present invention.

Embodiments of the present invention provide signal normalization that facilitates processing of a plurality of signals, especially signals from an ensemble source. In particular, embodiments of the present invention employ asynchronous pulse processing (APP) to implement and provide signal normalization of signals from a plurality of sources or input channels (e.g., an array of sensors). The provided signal normalization allows for robust signal processing in manner that may avoid a so-called noise-saturation dilemma, according to some embodiments. In some embodiments of the present invention, signal normalization based on a feed-forward on-center off-surround network is provided. The feed-forward on-center off-surround network may permit effective processing of arbitrary input patterns across multiple input channels while avoiding saturation even when faced with signals having large input dynamic ranges. Specifically, embodiments of the present invention facilitate multi-channel processing of very large signals without small signals in adjacent channels being treated as noise (i.e., the noise saturation dilemma). Further, embodiments of the present invention may be realized using inherently low-power circuits or equivalent implementations using asynchronous pulse processing. In particular, by implementing such circuits in the pulse domain using APP rather than the time or frequency domain, the resulting physical implementation may smaller and further may use less power for the same functionality, for example.

In some embodiments, the feed-forward on-center off-surround network may model or be based on neural cellular interactions. In particular, a feed-forward on-center off-surround network model may be given by equation (1) as $$\frac{dX_i}{dt} = -X_i A + (B - X_i)I_i - (C + X_i)\sum_{k \neq i} I_k \qquad (1)$$

where $X_i$ represents a normalized output signal of an i-th channel of the network and where $I_i$ represents a channel-specific input signal of the i-th channel, which is one of a plurality of input signals represented by $I_k$ indexed on an integer k. The plurality of input signals $I_k$ includes a number n of signals, where n is an integer larger than one. In some embodiments, the number n of signals is much larger than one (e.g., 1,000 to 10,000 or more). Further, by definition, the input signal $I_i$ is explicitly recognized as one of the plurality of input signals $I_k$ (i.e., i∈k where $1 \leq k \leq n$). In equation (1), a first term $X_i A$ acts as a decay term, a second term $(B-X_i)I_i$ of equation (1) represents an excitatory term and a third term $$(C + X_i)\sum_{k \neq i} I_k$$

is effectively an inhibitory term. Further in equation (1), the third or inhibitory term explicitly does not include the i-th channel-specific input signal as indicated by the 'k≠i' notation of the summation. Instead, the i-th channel-specific input signal is included in the excitatory term. The excitatory term is associated with an 'on' part of the plurality of input signals $I_k$, while the inhibitory term corresponds to an 'off' part of the input signals of the plurality. The variables A, B and C are scale values of the feed-forward on-center off-surround network that provide for control of a performance of the network. Equation (1) is described in further detail by S. Grossberg, "Why Do Cells Compete? Some Examples From Visual Perception," UMAP Journal, Vol. 3, No. 1, 1982, pp. 101-121, incorporated herein by reference.

In some embodiments, values of the variables A and B are selected such that the variable B is greater than A (i.e., B>A). In some embodiments, values of the variables B and C are chosen such that the variable C divided by a summation of the variables B and C is less than a level of the input signal $I_i$ (i.e., $I_i > C/(B+C)$). Choosing the values of B and C according to this embodiment may provide that the normalized signal $X_i$ is bounded by −C and B (i.e., $-C \leq X_i < B$).

Embodiments of the present invention employ time encoding as part of asynchronous pulse processing in providing signal normalization. Time encoding, as defined herein, effectively encodes a continuous amplitude variation in an analog signal as an asynchronous pulse sequence wherein one or both of a width and a position of pulses within the pulse sequence represents an amplitude variation of the analog signal. In effect, the time-encoding transforms the analog signal from a continuous amplitude, continuous time, analog domain to a time-encoded domain. The time-encoding transformation further facilitates time-encoded domain-based processing of the signal. Time-encoding is an alternative to classical analog-to-digital sampling methods in that time-encoding offers an approach to real-time asynchronous encoding of time-varying signal amplitude information as a time sequence of pulses. More information about time encoding and time encoders that provide time-encoding as employed herein is provided by Cruz-Albrecht et al., U.S. Pat. No. 7,403,144 B1, incorporated by reference in its entirety herein.

Herein, 'scaling' a signal is defined as multiplying the signal by a scalar value. Scaling generally affects a magnitude of the signal. For example, scaling a signal S by an arbitrary value K, with K being a scale value, is equivalent to forming a multiplicative product K·S. Scaling may be provided by a gain block, according to some embodiments. An amplifier with a specified gain or gain value is an example of a gain block.

Further herein, a multiplier or a multiplier block is used to multiply a first signal $S_1$ by a second signal $S_2$. In contrast to scaling, herein multiplying using a multiplier may affect both a magnitude and a frequency of a resultant signal when compared to the magnitudes and frequencies of the first and second signals $S_1$, $S_2$. A Gilbert multiplier comprising a differential pair of transistors is an example of an implementation of a multiplier.

Also herein, a 'signal' is defined as a time varying quantity. Thus, a signal may be generally represented by a function of time t as S(t). However, in general herein, signals are represented without explicit reference to time for simplicity of notation and not by way of limitation. For example, the signal S(t) may be denoted or represented simply as 'S'.

Embodiments of the present invention may be implemented using a variety of means including, but not limited to, integrated circuits (ICs), very large scale integrated (VLSI) circuits, application specific integrated circuits (ASIC), software and firmware. For example, elements or 'blocks' of an apparatus of the present invention may all be implemented as circuit elements within an ASIC or a VLSI circuit. In another example, the entire apparatus may be implemented as software using a computer programming language (e.g., C/C++) or software-based modeling environment (e.g., Matlab). In yet another example, some of the blocks may be implemented using actual circuitry (e.g., as an IC or an ASIC) while other blocks may be implemented in software or firmware.

As used herein, the article 'a' is intended to have its ordinary meaning in the patent arts, namely 'one or more'. For example, 'a channel' generally means 'one or more channels' and as such, 'the channel' means 'the channel(s)' herein. Herein, the term 'about' when applied to a value generally means plus or minus 10% unless otherwise expressly specified. Also, any reference herein to 'top', 'bottom', 'upper', 'lower', 'up', 'down', 'left' or 'right' is not intended to be a limitation herein. Moreover, examples herein are intended to be illustrative only and are presented for discussion purposes and not by way of limitation.

FIG. 1 illustrates a block diagram of an asynchronous pulse processing (APP) apparatus 100, according to an embodiment of the present invention. The APP apparatus 100 receives an input signal 101 that is one of a plurality of input signals. The APP apparatus 100 normalizes the input signal 101 using information provided, in part, by other ones of the input signals of the plurality. The APP apparatus 100 produces a normalized signal 102 as an output. As illustrated in FIG. 1, the APP apparatus 100 processes pulse-based or time-encoded input signals as opposed to analog input signals (i.e., the input signal 101 comprises a time-encoded input signal). In some embodiments, the APP apparatus 100 implements signal normalization based on a model of feed-forward on-center off-surround neural cellular interactions.

The APP apparatus 100 comprises a gain block 110. The gain block 110 is configured to scale the input signal 101 by a first scale value. The gain block 110 produces a scaled input signal 103 from the input signal 101. For example, when the first scale value is a scalar value B and the input signal 101 is represented by $I_i$ (as illustrated in FIG. 1) where i is an integer, the scaled input signal 103 may be given by $B \cdot I_i$. In some embodiments, the gain block 110 comprises an amplifier with gain given by the first scale value. For example, the gain block 110 may comprise a transconductance amplifier with a gain equal to the first scale value. The gain block 110 also may be referred to herein as the 'apparatus gain block' 110 to distinguish from subsequently described gain blocks.

The APP apparatus 100 further comprises a summation block 120. The summation block 120, also sometimes called an adder, is configured to produce a composite signal 104. The summation block 120 produces the composite signal 104 by subtracting from the scaled input signal 103 each of the normalized signal 102 scaled by a second scale value and the normalized signal 102 multiplied by a first summation signal 105. In some embodiments (e.g., as illustrated in FIG. 1), the summation block 120 is configured to additionally subtract from the scaled input signal a second summation signal scaled by a third scale value. Each of the second scale value, the first summation signal 105, the second summation signal and the third scale value are described below. The normalized signal 102 when scaled by the second scale value is referred to as a scaled normalized signal 106 in FIG. 1, while the second summation signal when scaled by the third scale value is referred to as a scaled second summation signal 107 in FIG. 1. Also, the normalized signal 102 multiplied by the first summation signal 105 is referred to as a multiplied signal 108 in FIG. 1. As illustrated, the summation block 120 comprises a plus input (labeled '+') and a plurality of minus inputs (labeled '−') as well as an output. In some embodiments, the summation block 120 is implemented using wire merging and electric current summation. The summation block 120 also may be referred to herein as the 'apparatus summation block' 120 to distinguish from subsequently described summation blocks.

In some embodiments, the second scale value is denoted by a value A. In these embodiments, if the normalized signal 102 is represented by $X_i$, then the scaled normalized signal 106 may be represented by $A \cdot X_i$. The scaled normalized signal 106 is communicated to a first one of the minus (−) inputs of the summation block 120, as illustrated in FIG. 1.

The first summation signal 105 represents a summation of the plurality of input signals. In particular, the first summation signal 105 is formed by summing together all of the input signals of the plurality including the input signal 101. For example, if the input signals are represented by $I_k$, where the integer index k ranges from 1 to n, then the first summation signal 105 may be represented by $\sum_1^n I_k$, or simply '$\Sigma I$' in FIG. 1. A number n of inputs signals in the plurality may be very large (e.g., n=10,000 or more), according to various embodiments. It should be noted that the input signal 101 is explicitly included in the plurality of input signals, as has been discussed above. For example, when the input signal 101 is represented by $I_i$ and the plurality of input signal is denoted $I_k$, then $I_i$ is a member of the plurality of input signals $I_k$ (i.e., $I_i \in I_k$).

In some embodiments, the multiplied signal 108 produced by multiplying the normalized signal 102 by the first summation signal 105 may be denoted as a multiplicative product $X_i \cdot \Sigma I$, where the normalized signal 102 is denoted $X_i$ and the first summation signal 105 is represented by $\Sigma I$. The multiplied signal 108 is communicated and applied to a second one of the minus (−) inputs of the summation block 120.

The second summation signal comprises the first summation signal 105 minus the input signal 101. Using the notation above, the second summation signal may be represented by '$\Sigma I - I_i$' or equivalently by $$\sum_{k \neq i} I_k$$

(e.g., as in equation (1)). Further, using similar notation, if the third scale value mentioned above is denoted by a value C, then the scaled second summation signal 107 may be represented by $C \cdot (\Sigma I - I_i)$ or equivalently by $$C \sum_{k \neq i} I_k.$$

In applicable embodiments, the scaled summation signal 107 is communicated to a third one of minus (−) inputs of the summation block 120.

The APP apparatus 100 further comprises an integrator 130. The integrator 130 is configured to integrate the composite signal 104 and produce an integrated signal 109. The integrated signal 109 produced by the integrator 130 represents a time integral of the composite signal 104. The integrator 130 may be implemented as any one or more of a number of known integrator circuits, for example. The integrator 130 also may be referred to herein as the 'apparatus integrator' 130 to distinguish from subsequently described integrators herein.

The APP apparatus 100 further comprises a time encoder 140. The time encoder 140 is configured to time-encode the integrated signal 109 and produce the normalized signal 102. The time encoder 140 provides asynchronous pulse-based encoding (i.e., time encoding) of a signal at an input of the time encoder 140.

Figure 2:
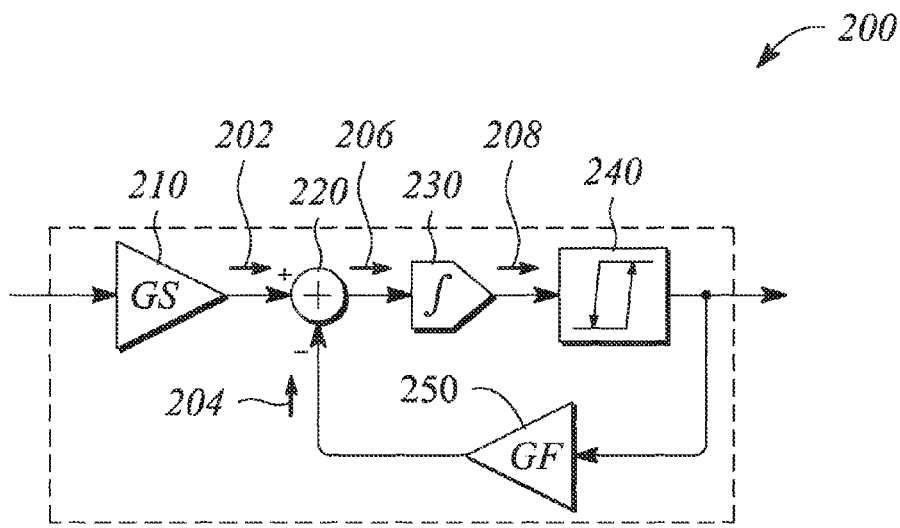
FIG. 2 illustrates a block diagram of a time encoder, according to an embodiment of the present invention.

FIG. 2 illustrates a block diagram of a time encoder 200, according to an embodiment of the present invention. The time encoder 200 may be used as the time encoder 140 of the APP apparatus 100, for example. As illustrated, the time encoder 200 comprises an input gain block 210. An input of the input gain block 210 is connected to or effectively is an input of the time encoder 200. The input gain block 210 is configured to receive and scale a signal present at the input of the time encoder 200 (e.g., the integrated signal 109). The input gain block 210 produces a scaled signal 202, as illustrated. In some embodiments, the input gain block 210 scales the signal present at the input of the time encoder 200 by a gain scale value GS. In some embodiments, the input gain block 210 comprises a transconductance amplifier having a gain value equal to the gain scale value (e.g., GS), as illustrated in FIG. 2. The input gain block 210 also is referred to as the 'TE gain block' 210 to distinguish from other described gain blocks herein.

The time encoder 200 illustrated in FIG. 2 further comprises a summation block 220. A plus (+) input of the summation block 220 is connected to an output of the input gain block 210. The summation block 220 is configured to subtract a feedback signal 204 from the scaled signal 202. The summation block 220 produces a difference signal 206. The summation block 220 also is referred to as the 'TE summation block' 220 to distinguish from other described summation blocks herein.

The time encoder 200 further comprises an integrator 230. An input of the integrator 230 is connected to an output of the summation block 220. The integrator 230 is configured to integrate the difference signal 206 output by the summation block 220. The integrator 230 produces an integrated difference signal 208 representing a time integral of the difference signal 206. The integrator 230 also is referred to as the 'TE integrator' 230 to distinguish from other described integrators herein.

The time encoder 200 further comprises a Schmidt trigger 240. An input of the Schmidt trigger 240 is connected to an output of the integrator 230. The Schmidt trigger 240 is configured to receive the integrated difference signal 208 output by the integrator 230 and to produce an output signal of the time encoder 200 (e.g., the normalized signal 102 illustrated in FIG. 1). The Schmidt trigger 240 acts as a hysteresis quantizer to threshold the signal produced by the integrator 230. The output signal produced by the Schmidt trigger 240 exits the time encoder 200 at an output of time encoder 200. While described herein specifically as a Schmidt trigger 240, the hysteresis quantizer functionality may be provided by other thresholding circuits that provide hysteresis quantizing and still be within the scope of the present invention.

As illustrated in FIG. 2, the time encoder 200 further comprises a feedback gain block 250. The feedback gain block 250 is connected between an output of the Schmidt trigger 240 (or equivalently the output of the time encoder 200) and a minus (−) input of the summation block 220. The feedback gain block 250 is configured to scale the Schmidt trigger output signal by a feedback scale value to produce the feedback signal 204. In some embodiments, the feedback scale value of the feedback gain block 250 is represented by a value GF. The feedback signal 204 is used by the summation block 220, as described above. The feedback gain block 250 also is referred to as the 'TE feedback gain block' 250 to distinguish from other described feedback gain blocks herein.

Referring again to FIG. 1, in some embodiments, the APP apparatus 100 further comprises a feedback gain block 150 configured to provide the scaled normalized signal 106. The feedback gain block 150 has a scale or gain value equal to the second scale value (e.g., the value A). The feedback gain block 150 is connected between an output of the time encoder 140 and the first one of the minus (−) inputs of the summation block 120. The feedback gain block 150 is configured to accept the normalized signal 102 and output the scaled normalized signal 106. The feedback gain block 150 may comprise a transconductance amplifier with a gain equal to the second scale value, for example. The feedback gain block 150 also is referred to as the 'apparatus feedback gain block' 150 to distinguish from other described feedback gain blocks herein.

In some embodiments, the APP apparatus 100 further comprises a multiplier 160. The multiplier 160 is connected between an output of the time encoder 140 and the second one of the minus (−) inputs of the summation block 120. The multiplier 160 multiplies the normalized signal 102 by the first summation signal 105 and provides the multiplicative product as the multiplied signal 108 to the second minus (−) input of the summation block 120, as illustrated. The multiplier 160 may comprise a Gilbert multiplier, for example.

In some embodiments, APP apparatus 100 further comprises a summation gain block 170. The summation gain block 170 may have a gain equal to the third scale value (e.g., the value C illustrated in FIG. 1), for example. The summation gain block 170 is configured to accept the second summation signal and produce the scaled second summation signal 107. In some embodiments, the APP apparatus 100 further comprises another apparatus summation block 180. The other apparatus summation block 180 is configured to produce the second summation signal by subtracting the input signal 101 from the first summation signal 105. According to some embodiments, the other apparatus summation block 180 may be connected between the inputs of the APP apparatus 100 that respectively receive the first summation signal 105 and the input signal 101 and an input of the summation gain block 170, as illustrated. In particular, the first summation signal 105 may be received by a plus (+) input of the other apparatus summation block 180 while the input signal 101 is received by a minus (−) input. In some embodiments, the other apparatus summation block 180 is implemented using wire merging and electric current summation.

In some embodiments, the first summation signal 105 is provided by an input summation block (not illustrated). The input summation block is configured to accept and sum together all of the input signals $I_k$ of the plurality including the input signal 101 (e.g., $I_i$). In some embodiments, the input summation block is implemented using wire merging and electric current summation.

In other embodiments (not illustrated), a mathematically equivalent implementation may be employed. For example, instead of providing the first summation signal 105 to the APP apparatus 100 as an input (e.g., using the input summation block), the first summation signal 105 may be replaced by a partial summation signal that includes all of the input signals $I_k$ of the plurality of input signals except the input signal 101

$$\left(\text{e.g., a signal represented by } \sum_{k \neq i} I_k\right).$$

In such embodiments, the partial summation signal is provided directly to the summation gain block (i.e., the other apparatus summation block described above is not employed). A summation block configured to add together the input signal 101 and the partial summation signal and provide the result to the multiplier is employed to create the first summation signal 105, according to these embodiments.

Figure 3:
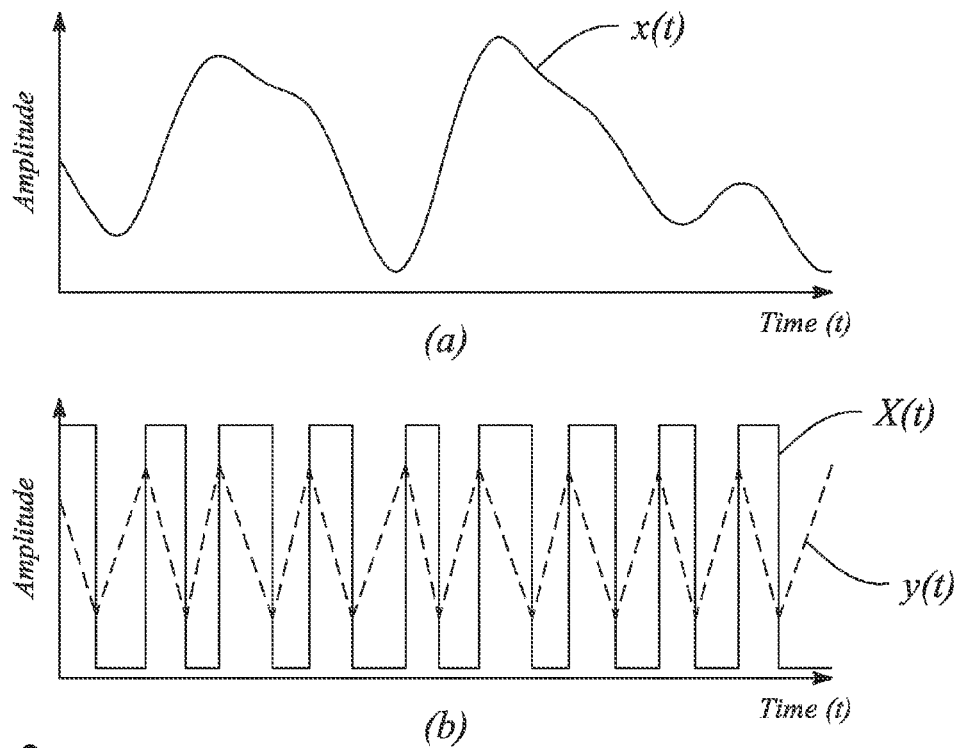
FIG. 3 illustrates a graphical example of time encoding using a time encoder, according to an embodiment of the present invention.

FIG. 3 illustrates a graphical example of time encoding using a time encoder, according to an embodiment of the present invention. The time encoder may be the time encoder 140 illustrated in FIG. 1 or the time encoder 200 illustrated in FIG. 2, for example. As illustrated, an upper graph (a) illustrates a plot of an exemplary analog signal x(t) as a function of time t. A lower graph (b) of FIG. 3 illustrates a signal y(t) as a dashed line representing a signal produced by an integrator, for example the integrator 230 and the integrated difference signal 208 of FIG. 2. Another curve (solid line) in the lower graph (b) of FIG. 3 illustrates a signal X(t) that represents a signal output by a thresholding circuit that provides hysteresis-quantizing functionality, for example the Schmidt trigger 240 of FIG. 2. As illustrated, the signal X(t) time-encodes the amplitude variation of the exemplary analog signal x(t), depicted as pulses of varying widths in FIG. 3.

Figure 4:
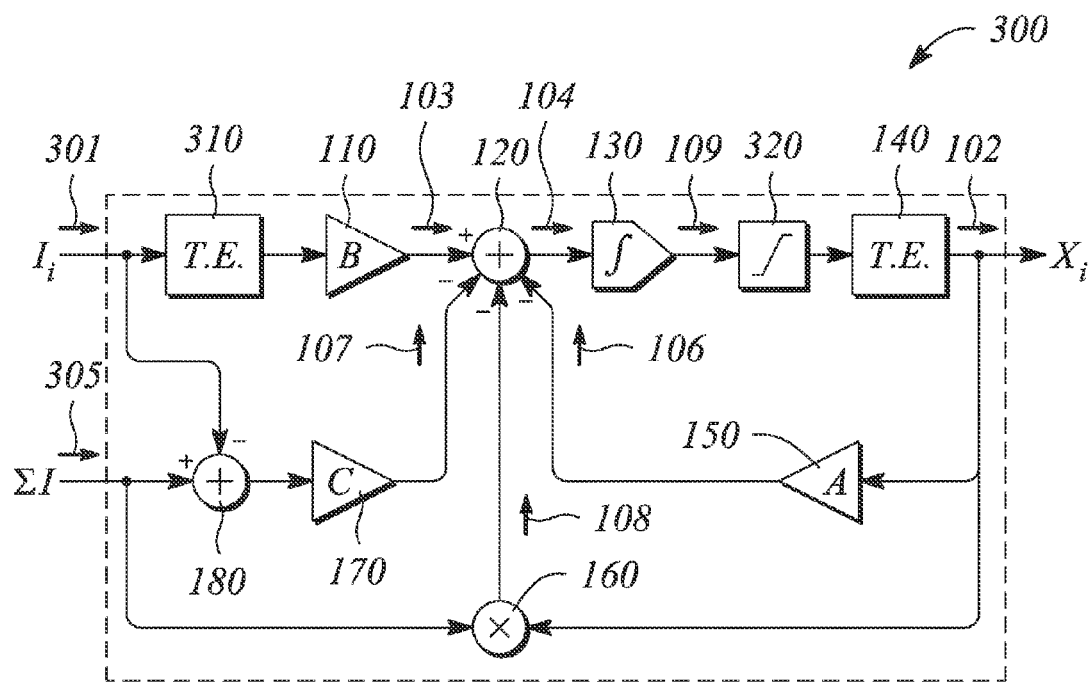
FIG. 4 illustrates a block diagram of an asynchronous pulse processing (APP) apparatus, according to another embodiment of the present invention.

FIG. 4 illustrates a block diagram of an asynchronous pulse processing (APP) apparatus 300, according to another embodiment of the present invention. As illustrated, the APP apparatus 300 is configured to receive and process an analog signal as an input signal 301. Moreover, all input signals of a plurality of input signals that includes the input signal 301 of the APP apparatus 300 comprise analog signals. In particular, the APP apparatus 300 differs from the APP apparatus 100 in that the APP apparatus 300 accepts an analog signal as the input signal 301 while the input signal 101 of the APP apparatus 100 is a time-encoded signal. Similarly, a first summation signal 305 provided to the APP apparatus 300 is an analog signal comprising a summation of the plurality of analog input signals, according to some embodiments. In some embodiments, the APP apparatus 300 implements signal normalization based on a model of feed-forward on-center off-surround neural cellular interactions.

As illustrated in FIG. 4, in some embodiments, the APP apparatus 300 comprises the APP apparatus 100, described above. In particular, the APP apparatus 300 comprises each of the gain block 110, the apparatus summation block 120, the integrator 130, the time encoder (TE) 140, the feedback gain block 150, and the multiplier 160, as described above with respect to the APP apparatus 100. Moreover, the various elements of the APP apparatus 100 within the APP apparatus 300 produce and process the scaled input signal 103, the composite signal 104, the scaled normalized signal 106, the multiplied signal 108, and the integrated signal 109, as described above for the APP apparatus 100. Similarly, the APP apparatus 300 processes both the second summation signal and the scaled second summation signal 107, as described above with respect to the APP apparatus 100. In some embodiments, the scaled second summation signal 107 is provided by the summation gain block 170, as described above. In some embodiments, the second summation signal is provided by the other apparatus summation block 180 configured to subtract the input signal 301 from the first summation signal 305, in a manner similar to that described above for the input signal 101 and the first summation signal 105 of the APP apparatus 100. In some embodiments, the first summation signal 305 is provided to the APP apparatus 300 by an input summation block (not illustrated).

The APP apparatus 300 further comprises another time encoder (TE) 310 in addition to the time encoder 140 of the APP apparatus 100. In particular, the time encoder 310 is connected between an input of the APP apparatus 300 and an input of the APP apparatus 100, or equivalently the gain block 110. The time encoder 310 is configured to time-encode the input signal 301 before the input signal 301 is received by the gain block 110. The additional time encoder 310 facilitates receiving and processing the analog input signal 301. The time encoder 310 is also referred to as the 'input time encoder' 310 to distinguish from other described time encoders herein.

In some embodiments, the time encoder 310 and the time encoder 140 differ from one another. For example, the time encoder 310 may have a different architecture than that of the time encoder 140. As such, the time encoder 310 may produce an asynchronous pulse sequence according to different criteria than is used by the time encoder 140, for example. In other embodiments, both the time encoder 310 and the time encoder 140 comprise a similar architecture (e.g., the architecture illustrated in FIG. 2) and produce similar asynchronous pulse sequences under similar signal conditions. However, respective ones of scale values of similar gain blocks within the two time encoders 310, 140 may differ or be independent of one another.

For example and referring to FIG. 2, both time encoders 310, 140 may comprise an input gain block 210 configured to scale a signal at the inputs of the time encoders 310, 140 by a respective scale value. The scale value of the input gain block 210 of the time encoder 140 may be represented by a value GS2 while the input gain block 210 of the other time encoder 310 may have a scale value represented by a value GS1, for example. In some embodiments, the value GS2 is not equal to (i.e., differs from) the value GS1. For example, the value GS1 may be equal to about 1800 while the value GS2 may be equal to about 1000. In other embodiments, the two values, GS2 and GS1, are about equal to one another.

Similarly, both of the time encoders 310, 140 may comprise a feedback gain block 250, as illustrated in FIG. 2. The scale value of the feedback gain block 250 of the time encoder 140 may be represented by a value GF2 while the feedback gain block 250 of the other time encoder 310 may have a scale value represented by a value GF1, for example. In some embodiments, the value GF2 is not equal to (i.e., differs from) the value GF1. For example, the value GF1 may be equal to about 1200 while the value GF2 may be equal to about 1000. In other embodiments, the two values, GF2 and GF1, are about equal to one another. In some embodiments, the values of GS1, GS2, GF1 and GF2 are selected to be between about 1000 and about 2000.

Continuing with reference to FIG. 2, both time encoders 310, 140 may further comprise the summation block 220 configured to subtract the feedback signal 204 from the scaled signal 202 received from the input gain block 210. Both exemplary time encoders 310, 140 may further comprise the integrator 230 configured to integrate the difference signal 206 output by the summation block 220 and the Schmidt trigger 240 or a relatively equivalent functionality. The Schmidt trigger 240 is configured to receive the integrated difference signal 208 output by the integrator 230 and to produce an output signal of the respective time encoder 310, 140. Both of the time encoders 310, 140 may further comprise the feedback gain block 250 configured to scale the respective time encoder 310, 140 output signal by a feedback scale value (e.g., GF1 and GF2, respectively) to produce the feedback signal 204 used by the summation block 220.

In some embodiments (e.g., as illustrated in FIG. 4), the APP apparatus 300 further comprises a sigmoid block 320 between the apparatus integrator 130 and the apparatus time encoder 140. The sigmoid block 320 provides smoothing of the integrated signal 109 from the apparatus integrator 130. A transmission characteristic of the sigmoid block 320 has an amplitude profile that approximates a sigmoid function. The sigmoid block 320 may be implemented by an amplifier (e.g., a transconductance amplifier) with saturation, for example. The sigmoid block 320 implemented as an amplifier with saturation may provide unity gain, for example.

In some embodiments, the APP apparatus 100, 300 is configured to implement a signal normalization based on a model of feed-forward on-center off-surround neural cellular interactions. In some of these embodiments, the first scale value is a value B, the second scale value is a value A, and the third scale value is a value C, respectively, where the values A, B and C are given by equation (1), provided above. When considering equation (1) above, $X_i$ represents the normalized signal 102 of the APP apparatus 100, 300 and $I_i$ represents the input signal 101, 301 of the APP apparatus 100, 300. For example, the feed-forward on-center off-surround model may be implemented with the value A equal to about 0.1, the value B equal to about 1.0. In some embodiments that include the summation gain block 170, the value C of the third scale value may be equal to about 0.

Figure 5:
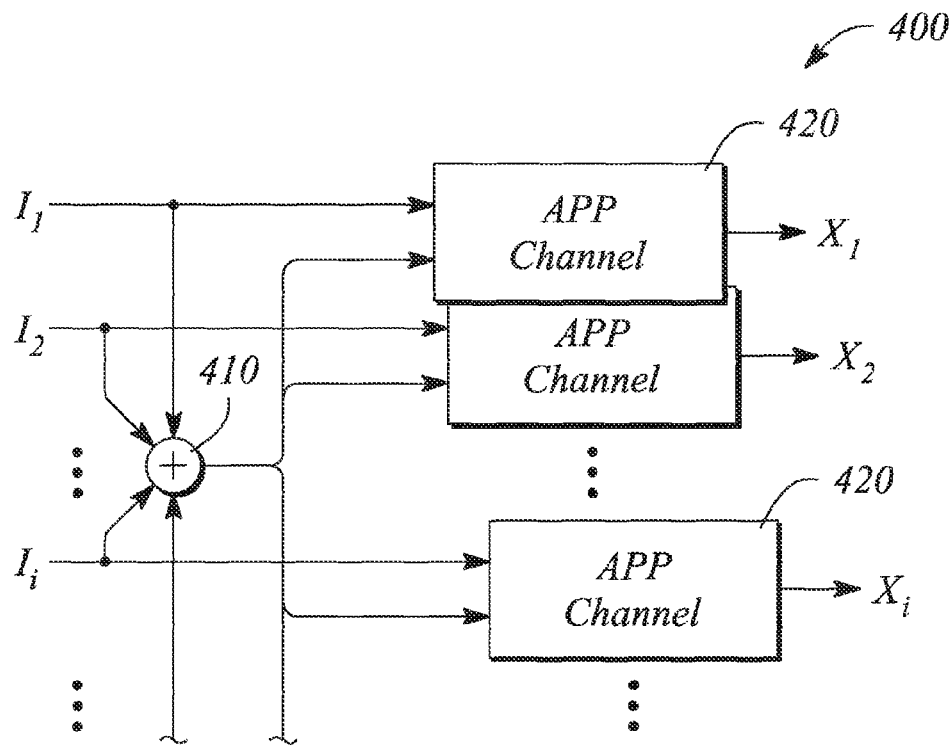
FIG. 5 illustrates a block diagram of an asynchronous pulse processing (APP) system, according to an embodiment of the present invention.

FIG. 5 illustrates a block diagram of an asynchronous pulse processing (APP) system 400, according to an embodiment of the present invention. In some embodiments, the APP system 400 comprises a plurality of one or both of the APP apparatuses 100, 300 as separate APP channels. Each of the APP apparatuses 100, 300 of the plurality of APP apparatuses is configured to receive a different input signal (i.e., a channel-specific input signal) of a plurality of input signals and to produce a channel-specific normalized signal.

In particular, the APP system 400 comprises a summation block 410, as illustrated in FIG. 5. The summation block 410 is configured to sum together the plurality of input signals and produce a summation signal. The summation signal may be substantially similar to the first summation signal 105, 305 described above with respect to the APP apparatus 100, 300. The summation block 410 may also be referred to as 'the system summation block' 410 to distinguish from other described summation blocks herein.

The APP system 400 further comprises a plurality of APP channels 420. Each of the APP channels 420 comprises an integrator and a first time encoder. For example, the integrator of the APP channel 420 may be substantially similar to the integrator 130 of the APP apparatus 100, 300, described above. Likewise, the first time encoder may be substantially similar to the time encoder 140 of the APP apparatus 100, 300, described above. Each of the APP channels 420 is configured to produce a channel-specific normalized signal (e.g., $X_i$) from a channel-specific composite signal.

In some embodiments, each of the APP channels 420 comprises the APP apparatus 100 and the channel-specific composite signal is substantially similar to the composite signal 104 of the APP apparatus 100. In these embodiments, each of the channel-specific input signals (i.e., $I_i$, where i ranges from 1 to n) are time-encoded input signals. In other embodiments, each of the APP channels 420 comprises the APP apparatus 300 and the channel-specific composite signal is substantially similar to the composite signal 104 of the APP apparatus 300. In these other embodiments, each of the channel-specific input signals (i.e., $I_i$, where i ranges from 1 to n) is an analog input signal.

The channel-specific composite signal comprises a channel-specific input signal $I_i$ scaled by a value B minus a channel-specific intermediate signal. In some embodiments, the channel-specific intermediate signal comprises the channel-specific normalized signal scaled by a value A plus the channel-specific normalized signal multiplied by the summation signal (e.g., $B \cdot I_i - [A \cdot X_i - \Sigma I \cdot X_i]$, using the notation introduced above). In some embodiments, the channel-specific intermediate signal further comprises a channel-specific scaled summation signal added to the channel-specific normalized signal scaled by a value A plus the channel-specific normalized signal multiplied by the summation signal. The channel specific scaled summation signal comprises a result of the summation signal minus the channel-specific input signal being scaled by a value C. In these embodiment, the channel-specific composite signal may be represented by $B \cdot I_i - [A \cdot X_i - \Sigma I \cdot X_i - C \cdot (\Sigma I - I_i)]$, using the notation introduced above. The channel-specific input signal $I_i$ is a different one of the input signals of the plurality for each of the APP channels 420.

In the embodiments when the APP channels 420 comprise the APP apparatus 300, each of the APP channels 420 further comprises one or both of a second time encoder and a sigmoid block. The second time encoder (i.e., the input time encoder 310 illustrated in FIG. 4) is configured to time-encode the channel-specific input signal before the channel-specific input signal $I_i$ is scaled by the value B. In these embodiments, the channel-specific input signal $I_i$ may comprise an analog signal. In these embodiments, the plurality of input signals used to produce the summation signal may also be analog signals. The sigmoid block (i.e., the sigmoid block 320 illustrated in FIG. 4) is located between the integrator and the first time encoder and is configured to provide smoothing of a signal output by the integrator prior to time encoding by the first time encoder. The sigmoid block may be substantially similar to the sigmoid block 320 illustrated in FIG. 4, in some embodiments.

In some embodiments, the APP system 400 further comprises a summation gain block 430. The summation gain block 430 is configured to accept a summation signal from the summation block 410 and to produce and provide to the APP channels 420 a scaled summation signal. The scaled summation signal is used by the APP channels 420 to produce the channel-specific composite signal, as described above. The summation gain block 430 may be substantially similar to the summation gain block 170 of the APP apparatus 100, 300, for example. In particular, the summation gain block 430 may have the scale value C. The summation gain block 430 may be referred to as 'the system summation gain block' 430 to distinguish from other described summation gain blocks herein.

Figure 6:
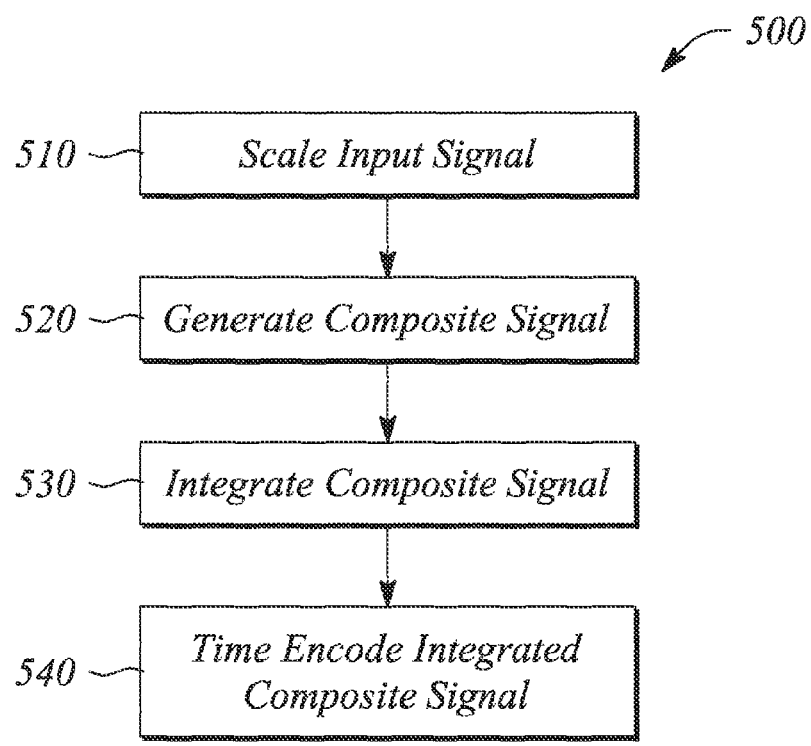
FIG. 6 illustrates a flow chart of a method of signal normalization using asynchronous pulse processing (APP), according to an embodiment of the present invention.

FIG. 6 illustrates a flow chart of a method 500 of signal normalization using asynchronous pulse processing (APP), according to an embodiment of the present invention. The method 500 of signal normalization comprises scaling 510 an input signal by a value B. The input signal is one of a plurality of input signals. The method 500 of signal normalization further comprises generating 520 a composite signal. In some embodiments, generating 520 a composite signal comprises subtracting from the scaled input signal each of a normalized signal scaled by a value A and the normalized signal multiplied by the summation signal. The summation signal is generated by summing together the inputs signals of the plurality, in various embodiments. In some embodiments, generating 520 a composite signal further comprises further subtracting from the scaled input signal a summation signal scaled by a value C. Subtracting the scaled summation signal is performed in addition to subtracting both of the scaled normalized signal and the multiplicative product of the normalized signal and the summation signal, according to these embodiments.

The method 500 of signal normalization further comprises integrating 530 the composite signal. Integrating 530 produces an integrated composite signal. The method 500 of signal normalization further comprises time encoding 540 the integrated composite signal to generate a normalized signal. The normalized signal represents a normalized version of the input signal. In some embodiments, the values A, B and C are selected to implement a signal normalization based on a model of feed-forward on-center off-surround neural cellular interactions given by equation (1), above.

In some embodiments not illustrated in FIG. 6 (e.g., see FIG. 4 instead), the method 500 of signal normalization further comprises time encoding the input signal prior to scaling 510 the input signal by the value B. In these embodiments, the input signal may comprise an analog signal. In some of these embodiments, the method 500 may further comprise smoothing the integrated composite signal before time encoding 540. In some embodiments, smoothing is provided by a sigmoid block. In other embodiments, smoothing may be provided by a low pass filter. For example, a Butterworth low pass filter may be used.

In some embodiments not illustrated in FIG. 6 (e.g., see FIG. 2 instead), time encoding 540 may comprise (a) scaling the integrated composite signal by a scale value GS. In some embodiments, time encoding 540 may further comprise (b) subtracting a feedback signal from the scaled integrated composite signal. The feedback signal is the normalized signal scaled by a feedback scale value GF. In some embodiments, time encoding further comprises (c) integrating a signal produced by (b) subtracting; and (d) thresholding a signal produced by (c) integrating to produce the normalized signal. In some of these embodiments, (d) thresholding is performed by a Schmidt trigger.

Thus, there have been described embodiments of an asynchronous pulse processing apparatus, an asynchronous pulse processing system and a method of signal normalization using asynchronous pulse processing. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. An asynchronous pulse processing (APP) apparatus comprising:
   an apparatus gain block configured to scale an input signal by a first scale value to produce a scaled input signal, the input signal being one of a plurality of input signals;

an apparatus summation block configured to produce a composite signal by subtracting from the scaled input signal each of a normalized signal scaled by a second scale value and the normalized signal multiplied by a first summation signal;

an apparatus integrator configured to integrate the composite signal and produce an integrated signal; and an apparatus time encoder configured to time-encode the integrated signal and produce the normalized signal, wherein the first summation signal represents a summation of the plurality of input signals.

2. The APP apparatus of claim 1, wherein apparatus summation block is further configured to additionally subtract from the scaled input signal a second summation signal scaled by a third scale value, the second summation signal comprising the first summation signal minus the input signal.

3. The APP apparatus of claim 1, wherein the apparatus time encoder (TE) comprises:
a TE input gain block configured to scale the integrated signal by an input scale value and produce a scaled integrated signal;
a TE summation block configured to subtract a feedback signal from the scaled integrated signal;
a TE integrator configured to integrate a signal output by the TE summation block;
a Schmidt trigger configured to receive a signal output by the TE integrator and produce the normalized signal; and
a TE feedback gain block configured to scale the normalized signal by a feedback scale value and produce the feedback signal used by the TE summation block.

4. The APP apparatus of claim 1, further comprising another time encoder configured to time-encode the input signal before the input signal is received by the apparatus gain block, the input signal comprising an analog signal.

5. The APP apparatus of claim 4, wherein each of the apparatus time encoder and the other time encoder comprise:
a TE input gain block configured to scale a signal at an input of the respective time encoder by a scale value;
a TE summation block configured to subtract a feedback signal from a signal received from the TE input gain block;
a TE integrator configured to integrate a signal output by the TE summation block;
a Schmidt trigger configured to receive a signal output by the TE integrator and produce an output signal of the respective time encoder; and
a TE feedback gain block configured to scale the respective time encoder output signal by a feedback scale value to produce the feedback signal used by the TE summation block,
wherein respective ones of the scale values of the TE input gain blocks and the TE feedback gain blocks of each of the apparatus time encoder and the other time encoder are independent of one another.

6. The APP apparatus of claim 4, further comprising a sigmoid block between the apparatus integrator and the apparatus time encoder, the sigmoid block being configured to smooth the integrated signal, wherein the apparatus time encoder is configured to time-encode the smooth integrated signal.

7. The APP apparatus of claim 1, further comprising a multiplier configured to receive the first summation signal and the normalized signal, the multiplier being configured to provide the normalized signal multiplied by the first summation signal to the apparatus summation block.

8. The APP apparatus of claim 1, further comprising an apparatus feedback gain block and an apparatus summation signal gain block, the apparatus feedback gain block being configured to receive the normalized signal and provide the normalized signal scaled by the second scale value to the apparatus summation block, the apparatus summation signal gain block being configured to receive the first summation signal and provide the first summation signal scaled by the third scale value to the apparatus summation block.

9. The APP apparatus of claim 2, wherein the first scale value is a value B, the second scale value is a value A, and the third scale value is a value C, the values A, B and C being selected to implement a signal normalization based on a model of feed-forward on-center off-surround neural cellular interactions given by $$\frac{dX_i}{dt} = -X_i A + (B - X_i)I_i - (C + X_i)\sum_{k \neq i} I_k$$

where $X_i$ represents a normalized output of the APP apparatus, $I_i$ represents the input signal to the APP apparatus represented by an index integer i, and $I_k$ represents the plurality of input signals indexed on an integer k not equal to the index i.

10. An APP system that employs the APP apparatus of claim 1, the APP system comprising a plurality of the APP apparatuses as APP channels, each of the APP channels being configured to receive a different one of the input signals of the plurality of input signals and configured to produce a channel-specific normalized signal.

11. An asynchronous pulse processing (APP) system comprising:
a system summation block configured to produce a summation signal from a plurality of input signals; and
a plurality of APP channels, each APP channel being configured to receive the summation signal and a respective channel-specific input signal of the plurality of input signals and being configured to produce a channel-specific normalized signal from a channel-specific composite signal, wherein each of the APP channels comprises an apparatus integrator and a first time encoder (TE),
wherein the channel-specific composite signal comprises the channel-specific input signal scaled by a first scale value minus a channel-specific intermediate signal, the channel-specific intermediate signal comprising the channel-specific normalized signal scaled by a second scale value plus the channel-specific normalized signal multiplied by the summation signal.

12. The APP system of claim 11, wherein the channel-specific intermediate signal further comprises a channel-specific scaled summation signal added to the channel-specific normalized signal scaled by the second scale value plus the channel-specific normalized signal multiplied by the summation signal, the channel-specific scaled summation signal comprising a result of the summation signal minus the channel-specific input signal being scaled by a third scale value.

13. The APP system of claim 11, wherein the first time encoder of each of the APP channels comprises:
a TE input gain block configured to scale an output signal of the apparatus integrator by a first TE scale value and produce a scaled integrated signal;
a TE summation block configured to subtract a feedback signal from the scaled integrated signal;
a TE integrator configured to integrate a signal output by the TE summation block;
a Schmidt trigger configured to receive a signal output by the TE integrator and produce the normalized signal; and a TE feedback gain block configured to scale the normalized signal by a TE feedback scale value and produce the feedback signal used by the TE summation block.

14. The APP system of claim 11, wherein each APP channel further comprises a second time encoder being configured to time-encode the channel-specific input signal before the channel-specific input signal is scaled by the first scale value, the channel-specific input signal comprising an analog signal.

15. The APP system of claim 14, wherein both of the first time encoder and the second time encoder of each APP channel independently comprise:
   a TE input gain block configured to scale a signal at an input of the respective time encoder by a TE input scale value;
   a TE summation block configured to subtract a feedback signal from a signal received from the TE input gain block;
   a TE integrator configured to integrate a signal output by the TE summation block;
   a Schmidt trigger configured to receive a signal output by the TE integrator and produce an output signal of the respective time encoder; and
   a TE feedback gain block configured to scale the respective time encoder output signal by a TE feedback scale value to produce the feedback signal used by the TE summation block,
   wherein respective ones of the scale values of the TE input gain blocks and the TE feedback gain blocks of each of the first time encoder and the second time encoder are independent of one another.

16. The App system of claim 14, wherein the TE input scale value and the TE feedback scale value of the first time encoder are about 1800 and 1200, respectively, and wherein the TE input scale value and the TE feedback scale value of the second time encoder are both about 1000.

17. The APP system of claim 13, wherein each APP channel further comprises a sigmoid block between the apparatus integrator and the first time encoder.

18. A method of signal normalization using asynchronous pulse processing (APP), the method comprising:
   scaling an input signal by a first scale value, the input signal being one of a plurality of input signals;
   generating a composite signal from the scaled input signal;
   integrating the composite signal to produce an integrated composite signal; and
   time encoding the integrated composite signal to generate a normalized signal,
   wherein generating a composite signal comprises subtracting from the scaled input signal each of the normalized signal scaled by a second scale value and the normalized signal multiplied by a first summation signal, the first summation signal being generated by summing together the inputs signals of the plurality.

19. The method of signal normalization of claim 18, further comprising:
   time encoding the input signal prior to the input signal being scaled by the first scale value, the input signal being an analog signal; and
   smoothing the integrated composite signal before the integrated composite signal is time encoded, wherein the integrated composite signal is smoothed by a sigmoid block.

20. The method of signal normalization of claim 18, wherein generating a composite signal further comprises subtracting from the scaled input signal a second summation signal scaled by a third scale value, the second summation signal comprising the first summation signal minus the input signal.

* * * * *